United States Patent [19]

Spencer et al.

[11] Patent Number: 4,623,417

[45] Date of Patent: Nov. 18, 1986

[54] MAGNETRON PLASMA REACTOR

[75] Inventors: John E. Spencer; Duane Carter, both of Plano; Dave Autery, Richardson, all of Tex.

[73] Assignee: Texas Instruments Incorporated, Dallas, Tex.

[21] Appl. No.: 768,547

[22] Filed: Aug. 23, 1985

[51] Int. Cl.$^4$ .............................. C23F 1/02; B44C 1/22; C03C 15/00; H01L 21/306
[52] U.S. Cl. .................................. 156/345; 118/728; 118/50.1; 118/620; 156/643; 156/646; 156/656; 204/298; 204/192.32
[58] Field of Search .................. 118/728, 50.1, 620; 427/38, 39; 204/192 EC, 192 E, 298; 156/345, 643, 646, 656, 657, 659.1, 662

[56] References Cited

U.S. PATENT DOCUMENTS

| 4,422,896 | 12/1983 | Class et al. | 156/643 |
| 4,483,737 | 11/1984 | Mantei | 156/643 |
| 4,572,759 | 2/1986 | Benzing | 156/345 |
| 4,581,118 | 4/1986 | Class et al. | 156/345 X |

FOREIGN PATENT DOCUMENTS

| 57-99744 | 6/1982 | Japan | 156/345 |
| 0159025 | 10/1982 | Japan | 156/643 |

Primary Examiner—William A. Powell
Attorney, Agent, or Firm—Robert Groover, III; James T. Comfort; Melvin Sharp

[57] ABSTRACT

A magnetron plasma reactor wherein the susceptor is an aluminum arm extending into approximately the middle of a solenoidal magnetic field generated by a dc current.

16 Claims, 1 Drawing Figure

MAGNETRON PLASMA REACTOR

BACKGROUND AND SUMMARY OF THE INVENTION

The present invention relates to plasma reactors, and to methods for processing semiconductor integrated circuits.

Plasma etching is a very important and widely used class of processes in fabrication of integrated circuits. It has long since been proposed, to further improve plasma etching processes, that magnetic confinement of the plasma would provide advantages of faster etching for a given pressure, and less radiation damage induced in the semiconductor device being etched. Another way of thinking of the advantages of magnetic confinement of the plasma in a plasma reactor is that the plasma impedance is lowered, so that a given rf current (or, approximately equivalently, a given density of excited states, dissociated ions, and free radicals in the plasma) can be achieved at a lower rf voltage. Use of a lower rf voltage means that the dc self-bias of the substrate will be lower, and therefore the kinetic energies of the ions bombarding the substrate will be lower, and therefore the damage induced by such energetic ions can be reduced. This damage is principally of two kinds: first, highly energetic ions will frequently generate xrays on impact, and these xrays can travel significant distances through solids to generate surface states, or to release free carriers within a dielectric to populate existing traps. This is a particularly sensitive issue in MOS devices, since such damage to gate oxides can cause threshold shift and other deleterious effects. Second, such high-energy ion bombardment has a greater chance of inducing defects in the substrate.

Thus, it has long been recognized that magnetic confinement of the plasma is attractive as an enhancement to existing plasma reactors wherein the wafer is exposed to the plasma (for example parallel plate reactors, hexode configuration RIE reactors, and others). However, although several such reactors using magnetically confined plasmas (generically known as "magnetron" etchers) are on the market, no fully satisfactory system has yet been developed.

The crucial problem of the prior art magnetron etchers has been non-uniformity. It is inherently rather difficult to get a completely flat magnetic field, particularly where that field is shaped with pole pieces, as has been common in the prior art. To compensate for this non-uniformity, many of the prior art systems have physically moved the permanent magnets which generated the field around, so that the average field seen across the wafer would be uniform, but this approach still has the difficulty that, during some portions of the travel of the magnets, the magnetic field will not be parallel to the surface of the wafer, and therefore those portions of the wafer will locally be exposed to bombardment by highly energetic ions, which loses one of the main advantages of magnetron etching in the first place. Other prior art methods have used modulation of the field, e.g. using electromagnets to modulate a field produced primarily by permanent magnets, but this still has problems of non-uniformity.

Moreover, any approach using permanent magnets, as many of the prior art approaches have done, faces the difficulty that the magnetic field strength is not a free parameter for process optimization. In view of the complex interactions involved in optimizing a plasma etching or a plasma deposition process, it is desirable to have control over all possible parameters, to assist in process optimization.

A further difficulty of prior art permanent magnet methods has been that the total field strength is relatively low, and moreover permanent magnets are inherently susceptible to degradation of magnetic field strength over time. However, a more important difficulty of permanent magnets may be that shaping the electrical field appropriately is likely to be quite difficult.

The present invention provides a magnetron plasma reactor wherein the wafer to be exposed to the plasma is supported on a cantilever which extends into the middle of a solenoidal coil. The solenoidal coil, which is preferably rf-grounded, is supplied with cooling water at a high flow rate, and can therefore take a large dc current to produce a substantial magnetic field. Using this apparatus, plasma etching and plasma-assisted deposition reactions can take place at low pressures with very high reaction rates, while minimizing radiation damage to the wafer being etched. The present invention also improves uniformity over the prior art magnetron etchers.

According to the present invention there is provided: A plasma reactor comprising: a vacuum chamber; means for supplying predetermined gases at a predetermined pressure to said vacuum chamber; a solenoidal coil defining a space therein; means for supplying current to said coil; a susceptor intruding into the space defined by said coil, and capable of supporting a semiconductor wafer in the space defined by said coil; and means for supplying rf power to said susceptor.

BRIEF DESCRIPTION OF THE DRAWINGS

The present invention will be described with reference to the accompanying drawings, wherein.

DESCRIPTION OF THE PREFERRED EMBODIMENTS

Figure 1:
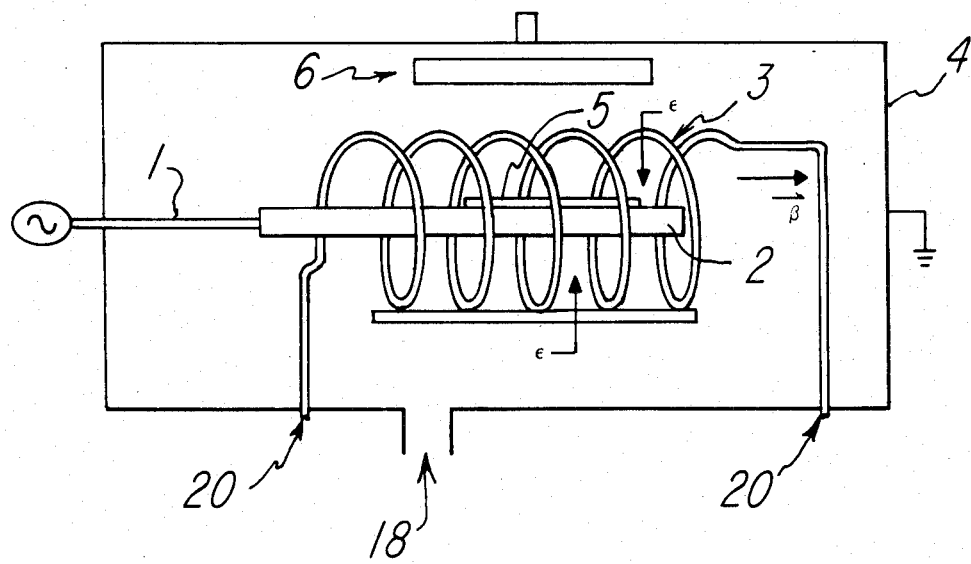
FIG. 1 shows a sample plasma reactor according to one embodiment of the invention.

The present invention will be described with primary reference to a few principally preferred embodiments, but it should be understood that the present invention can be widely modified and varied, and many other embodiments also fall within the scope of the invention. The scope of the present invention is expressly not limited except as set forth in the claims.

FIG. 1 shows a sample plasma reactor according to the present invention.

As shown in FIG. 1, a wafer 5 is supported on a susceptor 2 which extends into the approximate middle of the solenoidal coil 3. The coil 3 is supplied by dc power supply leads 20 to generate a magnetic field. Fluid connections (not shown) preferably connect the susceptor 12 to a fluid supply source for regulating the temperature of the substrate (wafer) 5 during etching. Vacuum pump connections 18 permit the chamber 4 to be pumped down to a desired pressure, and gas connections through a gas distributor 6 permit desired gases to be supplied for plasma reactions. Finally, an rf power connection 1 is fed through the chamber 4 to drive the susceptor 2.

In operation, a wafer 5 is placed on the susceptor 2, and the chamber is then pumped down and backfilled with a purge gas, such as dry nitrogen.

The coolant supply to susceptor 2 is now regulated to bring the wafer 5 to the desired temperature for the etching or deposition reaction, the desired feed gases are supplied, dc current is applied through leads 20, and rf power can now be applied through lead 1 to initiate the plasma reaction desired.

In the presently preferred embodiment, the susceptor 2 contains teflon isolation pieces which isolate the rf-powered portion of the susceptor from the remainder of the susceptor. This further assists in defining the volume of the chamber within which the plasma is generated.

Preferably a clamping arrangement is provided to assure good and consistent thermal contact between the wafer 5 and the susceptor 2. In the presently preferred embodiment, a ring clamp which attaches with screws is used, but a variety of other conventional arrangements can be used instead.

In the presently preferred embodiment, a water/glycol mixture is pumped through susceptor 2 to act as coolant, but other coolants, such as helium, could be used instead.

In the presently preferred embodiment, both the susceptor 2 and the magnetic field coil 3 are made of hard anodized aluminum. Moreover, these parts are preferably designed to be replaceable, so that, when exposure to plasma has significantly erroded the anodized coating (which it will eventually, perhaps after thousands of wafers have been processed) these parts can be removed and replaced with others and/or re-anodized. Naturally, these parts can be made of other materials suitable for exposure to a plasma, as is well known in the art.

It should be noted that the present invention is more advantageous when low pressures are being used. For example, when sulfur hexafluoride is being used as an etchant gas, the peak to peak rf voltage is no different above pressures of about 150 milliTorr whether or not the magnetic field is applied. However, at pressures in the neighborhood of 50 milliTorr, application of the magnetic field will reduce the rf peak to peak voltage from about 750 volts to about 250 volts. This corresponds to a substantial reduction in dc self-bias and in energetic ion bombardment.

In future embodiments of the present invention, it is preferable to use a mechanical arm to load the wafer 5 onto the susceptor 2. In this case, an automatic clamping arrangement is preferably provided, together with fingers in the susceptor which can protrude to lift the wafer 5 off of the susceptor 2 so that the mechanical arm can pick the wafer up.

The presently preferred embodiment is a single-slice reactor. The present invention could be generalized to a reactor which would carry several wafers at the same time, but it is most attractive when operated as a single-slice system. The advantages of uniformity across the wafer and of wafer-to-wafer uniformity are best preserved in a single-slice system.

A sample embodiment of plasma etching according to the present invention uses 500 watts of rf power, in a gas mixture of 10% oxygen plus 90% sulphur hexafluoride at 13 milliTorr, to etch tungsten at about 5000 angstroms per minute. The rf power density translates into approximately 0.55 watts per square centimeter.

Note that the present invention is particularly attractive as a plasma deposition reactor. For example, the reactor according to the present invention may be used with ammonia plus trichlorosilane at 200 degrees C. to deposit silicon nitride on the substrate with reduced deposition on the cold chamber walls.

The present invention is particularly advantageous with trench etches. In trench etches, such as are necessary for dynamic RAM cells using trench capacitors, low pressure etching is typically necessary to achieve the necessary anisotropy to etch trenches which are several microns deep in silicon. This means that etch rate is more critical to process manufacturability, and therefore magnetron etching (and therefore the present invention) become attractive.

The present invention is also particularly attractive for etching polysilicon gate levels in MOS circuits, since this etching step can have a particular deleterious effect on gate oxide integrity if radiation damage occurs, as discussed above.

In general, the present invention provides the advantages of fast plasma etching at low pressure with high uniformity. The present invention provides the further advantage of plasma etching at low pressure with reduced radiation damage. The present invention provides the further advantage of plasma etching at low pressure with reduced rf voltage, which implies better safety conditions.

The magnetic field is preferably adjusted to be in the neighborhood of 100 gauss, measured directly at the plane of the wafer. This may be tweaked up or down to provide fully optimized conditions for particular thin films being etched. When lower magnetic fields are used, the advantage of reduced dc self-bias voltage of the substrate will not be attained to as great a degree at lower pressures. Higher magnetic fields than 200 gauss could also be used, if desired, although for most films this is not necessary nor optimal. In general, a field strength within the range of 50 to 200 gauss is the most preferred range of embodiments of the present invention. In addition, pressures below 150 milliTorr are the most preferred pressures for etching according to the present invention, and the pressures below 100 milliTorr are particularly preferable. (For deposition according to the present invention, higher pressures can be used.)

The present invention has been described with reference to particularly preferred embodiments thereof, but the scope of the invention, which can be subjected to numerous modifications and variations, is not defined except by the accompanying claims.

What is claimed is:

1. A plasma reactor comprising:
   a vacuum chamber;
   means for supplying predetermined gases at a predetermined pressure to said vacuum chamber;
   a solenoidal coil defining a space therein;
   means for supplying current to said coil;
   a susceptor intruding into the space defined by said coil, and capable of supporting a semiconductor wafer in the space defined by said coil; and
   means for supplying rf power to said susceptor.

2. The reactor of claim 1, wherein said susceptor comprises a diamagnetic material.

3. The reactor of claim 1, wherein said coil comprises anodized aluminum.

4. The reactor of claim 1, wherein said susceptor comprises anodized aluminum.

5. The reactor of claim 1, wherein said susceptor further comprises coolant fluid connections.

6. The reactor of claim 1, wherein said coil is rf-grounded to said vacuum chamber.

7. The reactor of claim 1, wherein said solenoidal coil comprises more than ten turns.

8. The reactor of claim 1, wherein said current supplying means is adapted to supply more than 500 but less than 20,000 ampere-turns to said solenoidal coil.

9. The reactor of claim 1, wherein said susceptor further comprises a clamping means for affixing a wafer firmly to said susceptor with low thermal interface resistance.

10. The reactor of claim 1, wherein said coil comprises a diamagnetic material.

11. The reactor of claim 1, wherein said coil is anodized aluminum tubing through which coolant can be passed.

12. The reactor of claim 1, wherein said coil is of spacing such as to allow magnetic field non-uniformity at the surface of said susceptor of less than 5%.

13. The reactor of claim 12, wherein said coil has a coil diameter to coil spacing ratio of 0.25 or more.

14. The reactor of claim 1, wherein said coil is of spacing such as to allow free, non-disrupted flow of reactant gases to the wafer.

15. The reactor of claim 14, wherein said coil has a coil diameter to coil spacing ratio of 0.75 or less.

16. The reactor of claim 1, wherein said coil is configured to provide a sufficiently large opening to allow a wafer handling means to bring a wafer to said susceptor without disturbing said coil.

* * * * *